US012692842B2

(12) United States Patent
Fernandez Romero et al.

(10) Patent No.: US 12,692,842 B2
(45) Date of Patent: Jul. 28, 2026

(54) ESTIMATING AN UPGRADED POWER CURVE

(71) Applicant: Siemens Gamesa Renewable Energy Innovation & Technology S.L., Sarriguren (ES)

(72) Inventors: Ignacio Fernandez Romero, Pamplona (ES); Alexander Meinicke, Bremerhaven (DE); Pablo Desco Santos, Madrid (ES)

(73) Assignee: SIEMENS GAMESA RENEWABLE ENERGY INNOVATION & TECHNOLOGY S.L., Sarriguren (ES)

( * ) Notice: Subject to any disclaimer, the term of this patent is extended or adjusted under 35 U.S.C. 154(b) by 396 days.

(21) Appl. No.: 18/565,986

(22) PCT Filed: May 25, 2022

(86) PCT No.: PCT/EP2022/064152
§ 371 (c)(1),
(2) Date: Nov. 30, 2023

(87) PCT Pub. No.: WO2022/258373
PCT Pub. Date: Dec. 15, 2022

(65) Prior Publication Data
US 2024/0254971 A1      Aug. 1, 2024

(30) Foreign Application Priority Data

Jun. 9, 2021      (EP) ..................................... 21382512

(51) Int. Cl.
*F03D 17/00*          (2016.01)
*F03D 7/00*            (2006.01)
(Continued)

(52) U.S. Cl.
CPC ............. *F03D 17/026* (2023.08); *F03D 7/00* (2013.01); *F03D 7/048* (2013.01); *F03D 17/021* (2023.08);
(Continued)

(58) Field of Classification Search
None
See application file for complete search history.

(56) References Cited

U.S. PATENT DOCUMENTS

| | | | | |
|---|---|---|---|---|
| 9,127,642 B2 * | 9/2015 | Zhu | ........................... | F03D 7/00 |
| 9,797,377 B2 * | 10/2017 | Bhaskar | .................. | F03D 9/257 |

(Continued)

FOREIGN PATENT DOCUMENTS

| | | | | | |
|---|---|---|---|---|---|
| BR | 102015009549 A2 * | 2/2018 | ............. | F03D 9/257 |
| BR | 102015009549 B1 * | 8/2022 | ............. | F03D 7/028 |

(Continued)

OTHER PUBLICATIONS

Axel Albers, Side-by-Side Testing to Verify Improvements of Power Curves, Deutsche Windguard, 2014, Nordic Wind Power Conference in Stockholm, 31 pages.

(Continued)

*Primary Examiner* — Kevin R Steckbauer
(74) *Attorney, Agent, or Firm* — Schmeiser Olsen PLLC

(57) ABSTRACT

A method of estimating a second power curve of a wind turbine regarding a second operational configuration includes: receiving power output data pertaining to a first operational configuration, in particular reference operational configuration; receiving power data relating to power output pertaining to the second operational configuration; deriving the second power curve using the power output data pertaining to the first operational configuration, the power (Continued)

Figure 1:
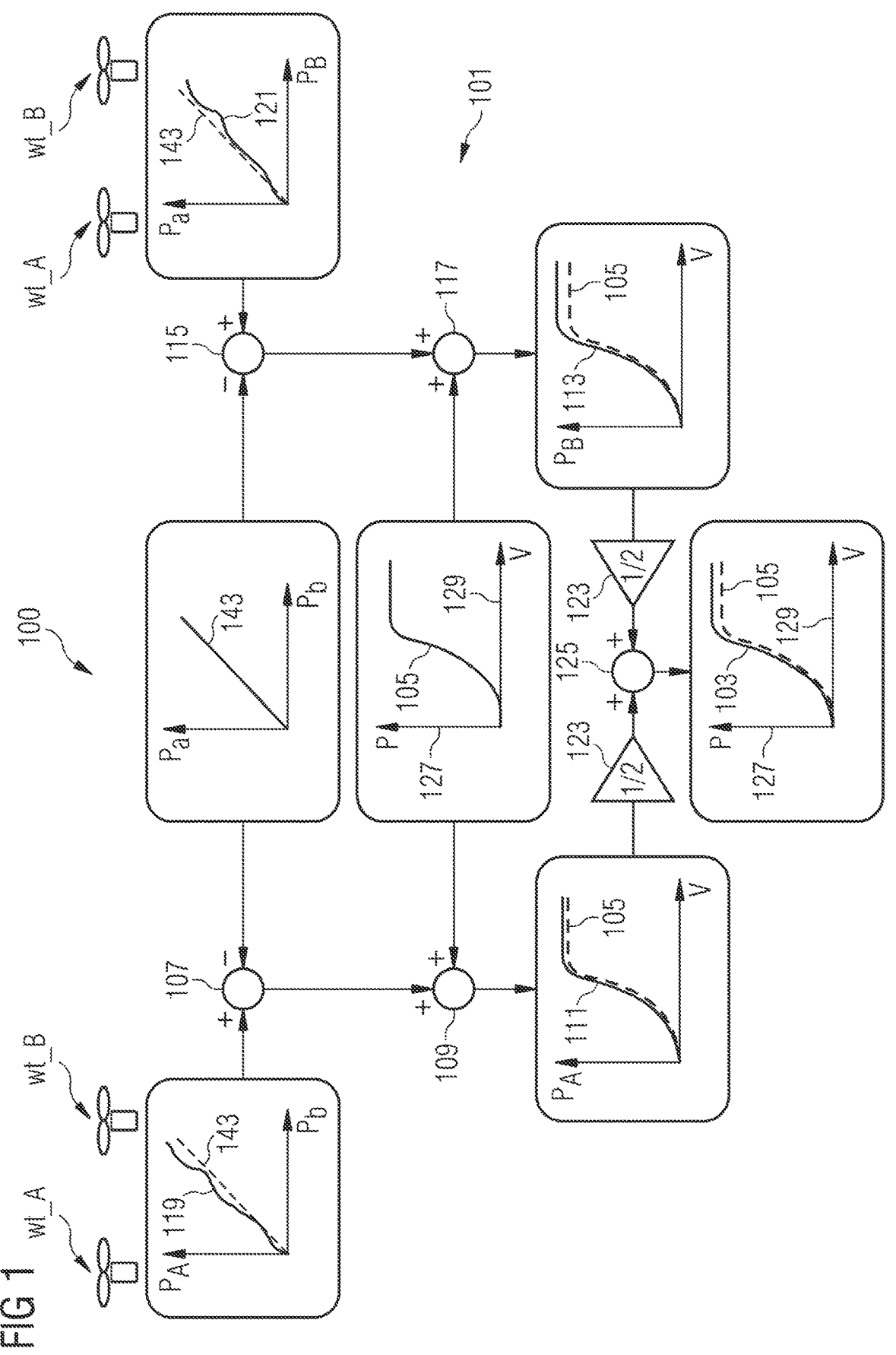

output data pertaining to the second operational configuration and a first power curve of the first operational configuration.

15 Claims, 2 Drawing Sheets

(51) Int. Cl.

| | |
|---|---|
| *F03D 7/04* | (2006.01) |
| *G01R 21/06* | (2006.01) |
| *H02J 3/00* | (2026.01) |

(52) U.S. Cl.

CPC .............. *G01R 21/06* (2013.01); *H02J 3/004* (2020.01); *F05B 2270/1033* (2013.01); *F05B 2270/32* (2013.01); *F05B 2270/327* (2013.01); *F05B 2270/335* (2013.01)

(56) References Cited

U.S. PATENT DOCUMENTS

| | | | | |
|---|---|---|---|---|
| 10,006,438 | B2 * | 6/2018 | de Boer | F03D 7/0224 |
| 10,385,829 | B2 * | 8/2019 | Wilson | F03D 7/028 |
| 10,393,093 | B2 * | 8/2019 | Gregg | F03D 7/0224 |
| 10,697,439 | B2 * | 6/2020 | Wheeler | F03D 7/04 |
| 10,712,717 | B2 | 7/2020 | Onetto et al. | |
| 10,815,972 | B2 | 10/2020 | Evans et al. | |
| 11,157,261 | B2 * | 10/2021 | Berra | F03D 7/046 |
| 11,274,656 | B2 * | 3/2022 | Lebosq | F03D 7/0276 |
| 11,561,264 | B2 * | 1/2023 | Berasain Balda | H02H 7/04 |
| 12,047,027 | B2 * | 7/2024 | Agudo Araque | H02P 29/68 |
| 12,129,834 | B2 * | 10/2024 | Canales Segade | F03D 80/003 |
| 12,355,386 | B2 * | 7/2025 | Rodriguez Izal | H02P 9/008 |
| 12,393,886 | B2 * | 8/2025 | Barrenechea Gruber | G06Q 10/04 |
| 12,494,653 | B2 * | 12/2025 | Mendizabal Abasolo | G06Q 10/0631 |
| 2015/0211486 | A1 * | 7/2015 | de Boer | F03D 7/0224 290/44 |
| 2015/0308413 | A1 * | 10/2015 | Bhaskar | F03D 9/257 290/44 |
| 2016/0265513 | A1 | 9/2016 | Evans et al. | |
| 2016/0298607 | A1 * | 10/2016 | Gregg | F03D 7/0224 |
| 2017/0328348 | A1 * | 11/2017 | Wilson | F03D 7/048 |
| 2018/0363632 | A1 * | 12/2018 | Wheeler | F03D 7/043 |
| 2019/0010924 | A1 | 1/2019 | Theopold et al. | |
| 2020/0293300 | A1 * | 9/2020 | Berra | F03D 7/046 |
| 2020/0309093 | A1 * | 10/2020 | Lebosq | F03D 17/00 |
| 2021/0389385 | A1 * | 12/2021 | Berasain Balda | H02H 7/045 |
| 2022/0255323 | A1 * | 8/2022 | Mendizabal Abasolo | G06Q 10/0631 |
| 2023/0006600 | A1 * | 1/2023 | Agudo Araque | H02P 29/68 |
| 2023/0073358 | A1 * | 3/2023 | Barrenechea | G06Q 10/04 |
| 2023/0374973 | A1 * | 11/2023 | Canales Segade | H02J 3/381 |
| 2024/0117791 | A1 * | 4/2024 | Holtom | F03D 17/011 |
| 2024/0209835 | A1 * | 6/2024 | Gkountaras | F03D 7/0284 |
| 2024/0254971 | A1 * | 8/2024 | Fernandez Romero | F03D 17/021 |
| 2024/0305227 | A1 * | 9/2024 | Bermejo Hernandez | F03D 17/021 |
| 2024/0313678 | A1 * | 9/2024 | Rodriguez Izal | H02P 29/50 |
| 2025/0096708 | A1 * | 3/2025 | Rodriguez Vazquez | H02M 1/08 |
| 2025/0247030 | A1 * | 7/2025 | Gude Rodriguez | H01F 29/04 |

FOREIGN PATENT DOCUMENTS

| | | | | | |
|---|---|---|---|---|---|
| BR | 112016011109 | B1 | * | 1/2023 | F03D 7/0224 |
| CA | 2888739 | C | * | 2/2019 | F03D 9/257 |
| CN | 102047514 | A | | 5/2011 | |
| CN | 102208050 | A | | 10/2011 | |
| CN | 102748219 | A | * | 10/2012 | F03D 17/00 |
| CN | 102748219 | B | * | 12/2016 | F03D 15/00 |
| CN | 109083815 | A | * | 12/2018 | F03D 7/04 |
| CN | 111164304 | A | | 5/2020 | |
| CN | 111350638 | A | * | 6/2020 | F03D 17/00 |
| CN | 113169544 | A | * | 7/2021 | H02H 7/04 |
| CN | 114154755 | A | * | 3/2022 | G06Q 10/04 |
| CN | 114585950 | A | * | 6/2022 | G06N 3/045 |
| CN | 114902251 | A | * | 8/2022 | G06Q 10/04 |
| CN | 115989512 | A | * | 4/2023 | G06Q 10/04 |
| CN | 116508222 | A | * | 7/2023 | F03D 80/003 |
| CN | 117083794 | A | * | 11/2023 | H02P 9/007 |
| CN | 117223185 | A | * | 12/2023 | H02J 13/12 |
| CN | 117480320 | A | * | 1/2024 | G01R 21/06 |
| CN | 117882261 | A | * | 4/2024 | G01R 19/2513 |
| CN | 118984910 | A | * | 11/2024 | F03D 7/0284 |
| CN | 119137855 | A | * | 12/2024 | H02P 13/06 |
| DE | 102019108244 | A1 | * | 10/2020 | F03D 7/048 |
| EP | 2940295 | A1 | * | 11/2015 | F03D 9/257 |
| EP | 2679813 | B1 | | 1/2017 | |
| EP | 3380725 | B1 | | 10/2019 | |
| EP | 3077668 | B1 | * | 7/2020 | F03D 9/257 |
| EP | 3715626 | A1 | * | 9/2020 | F03D 7/048 |
| EP | 3472455 | B1 | * | 10/2021 | G05B 13/024 |
| EP | 3715626 | B1 | * | 11/2021 | F03D 7/0276 |
| EP | 4084257 | A1 | * | 11/2022 | H02J 13/12 |
| EP | 4102059 | A1 | * | 12/2022 | F03D 7/046 |
| EP | 4298706 | B1 | * | 7/2024 | H02J 13/12 |
| EP | 4323639 | B1 | * | 11/2024 | G01R 21/06 |
| ES | 2995070 | T3 | * | 2/2025 | H02J 13/12 |
| ES | 2995867 | T3 | * | 2/2025 | G01R 21/06 |
| TW | 201433691 | A | * | 9/2014 | F03D 1/181 |
| WO | WO-2011101475 | A2 | * | 8/2011 | G01P 21/025 |
| WO | WO-2015077337 | A1 | * | 5/2015 | F03D 9/257 |
| WO | WO-2019063050 | A1 | * | 4/2019 | F03D 17/00 |
| WO | WO-2022228782 | A1 | * | 11/2022 | H02J 13/12 |
| WO | WO-2022258373 | A1 | * | 12/2022 | F03D 7/046 |

OTHER PUBLICATIONS

PCT-ISR, Date of Mailing Aug. 31, 2022, International Filing Date: May 25, 2022, Applicant's File Reference: 2021P07235WO, International application No. PCT/EP2022/064152, 14 pages.

\* cited by examiner

ESTIMATING AN UPGRADED POWER CURVE

CROSS-REFERENCE TO RELATED APPLICATIONS

This application claims priority to PCT Application No. PCT/EP2022/064152, having a filing date of May 25, 2022, which claims priority to EP Application No. 21382512.8, having a filing date of Jun. 9, 2021, the entire contents both of which are hereby incorporated by reference.

FIELD OF TECHNOLOGY

The following relates to a method of estimating a second power curve of a wind turbine regarding a second operational configuration, in particular upgraded operational configuration. Furthermore, the following relates to a corresponding arrangement for estimating a second power curve and furthermore relates to a system comprising the arrangement and at least two wind turbines.

BACKGROUND

During a lifetime of a wind turbine, the wind turbine may receive an upgrade regarding hardware and/or software. In particular, the upgrade may be aimed to increase power output of the wind turbine. Therefore, the performance of the wind turbine after the upgrade needs to be determined. In particular, the energy improvement may be needed to be quantified in a manner credible to the customer.

EP 2 679 813 B1 discloses a method and arrangement for optimizing a parameter setting of a wind turbine.

The publication "Side by Side Testing to Verify Improvements of Power Curves", Deutsche Windguard, 2014, Nordic Wind Power Conference in Stockholm, discloses side by side testing to verify improvements of power curves. The methods disclosed therein require relatively long measurement times and are not efficient (e.g. regarding measurement time) enough in all circumstances.

EP 3380725 B1 discloses a method for monitoring and assessing power performance changes of one or more wind turbines of a wind farm.

U.S. Ser. No. 10/815,972 B2 discloses a method for assessing or validating wind turbine or wind farm performance produced by one or more upgrades, wherein measurements of operating data from wind turbines in a wind farm are obtained.

In the conventional method it has been observed that in particular in the partial power production mode, it may be difficult to assess the effects of the upgrade. Regular power-curve analysis using a met mast or lidar based wind speed measurement data may not be accurate enough. Conventionally, differential methods which compare energy output before and after the upgrade may have been employed. However, necessary accuracy has been observed to be hardly achievable and the conventional methods require relatively long measurement times.

Thus, there may be a need for a method of determining an upgraded power curve (in particular or generally second power curve) of a wind turbine regarding a second operational configuration (in particular upgraded operational configuration), wherein accuracy is improved and/or measurement time is shortened.

SUMMARY

According to an embodiment of the present invention it is provided a method of estimating a second power curve of a wind turbine regarding a second operational configuration, the method comprising: receiving power output data pertaining to a first operational configuration, in particular reference operational configuration; receiving power data relating to power output pertaining to the second operational configuration; deriving the second power curve using the power output data pertaining to the first operational configuration, the power output data pertaining to the second operational configuration and a first power curve of the first operational configuration.

Thereby, receiving power data relating to power output pertaining to the second operational configuration comprises: receiving power data relating to power output of at least one first wind turbine (e.g. wt_A) operated according to the second operational configuration in a first time interval; receiving power output data pertaining to the first operational configuration comprises: receiving power data relating to power output of at least one second wind turbine (e.g. wt_B) operated according to the first operational configuration in the first time interval, the method further comprising: receiving power data relating to power output of the first wind turbine (e.g. wt_A) operated according to the first operational configuration in a second time interval, receiving power data relating to power output of the second wind turbine (e.g. wt_B) operated according to the second operational configuration in the second time interval; wherein deriving the second power curve is based on: the power data relating to power output of the first wind turbine (e.g. wt_A) operated according to the second operational configuration in the first time interval; the power data relating to power output of the second wind turbine (e.g. wt_B) operated according to the first operational configuration in the first time interval, the power data relating to power output of the first wind turbine (e.g. wt_A) operated according to the first operational configuration in the second time interval; the power data relating to power output of the second wind turbine (e.g. wt_B) operated according to the second operational configuration in the second time interval; and the first power curve.

The method may for example be implemented in software and/or hardware and may for example be performed by a module of a wind park controller or a module of one or more wind turbines.

The first/second power curve may indicate the power output of the wind turbine depending on the wind speed when the wind turbine is operated according to the first/second operational configuration. The method may be a particular variant of a differential method, wherein the performance, in particular active power output, of one or at least two wind turbines are compared when operated according to the first operational configuration and the second operational configuration.

The power output data from at least two different wind turbines (operated according to the first operational configuration and the second operational configuration, in particular in a same time interval) may be received which may for example be arranged close to each other (such as in a distance range between 100 m and 5 km for example), which may for example be comprised in a single wind park.

When at least two different wind turbines are considered, they may be subjected to similar or even same wind conditions. In particular, wake conditions may be avoided. The method in particular may not require to consider any wind speed measurement data for finally deriving the second power curve. When at least two different wind turbines are employed and when their respective power output data are considered and used for determining the second power curve, the two different wind turbines may be of a same type and general constructional design.

When plural wind turbines are considered, plural switchings may be performed and after each switching (for example after a sufficient waiting time such as to settle to the newly set operational configuration) the respective power output data may be collected. When a single wind turbine is present or being examined, plural measurement intervals are provided when operating the wind turbine according to the first operational configuration and plural other measurement intervals are provided, while the wind turbine is operated according to the second operational configuration. Thereby, changes of the wind condition, in particular wind speed, may be averaged out.

The power output data may relate to power output by a generator of the wind turbine, the power output data may for example be based on measurements of voltage and/or current at an output terminal of the wind turbine. Therefore, the wind turbine may be equipped with measurement sensors, in particular voltage sensors and current sensors.

The first power curve may represent or be an expected original or reference power curve or guaranteed original power curve, for example a power curve which applied before upgrading the wind turbine to the second operational configuration. However, embodiments of the present invention also allow to assess any two operational configurations, so not necessarily restricted to a reference operational configuration and an upgraded operational configuration.

When the differential method is employed, wind speed measurements are not required. Furthermore, the method may not require to acquire and utilize any power output data for two different wind turbines which are operated in the same operational configuration. In conventional methods, two different wind turbines may have been operated in the reference operational configuration and output data obtained from the two wind turbines have been considered in order to derive a power curve for the upgraded operational configuration. According to embodiments of the present invention, this is not necessary any more. Thereby, measurement time may be reduced, while the accuracy of the finally derived second power curve may be sufficiently high.

The method may not only be applied to wind turbines, but may be applied to any energy or power generating facilities which need evaluation regarding different operational configurations. For example, the method may be applied to solar production facilities, water tide power production facilities or other production facilities. The method may for example as an additional step also derive an estimated change or improvement of annual energy production (AEP) by integrating the second power curve according to a local or reference wind speed distribution for example.

The subsequent embodiments relate to employment of at least two wind turbines (or plural pairs of wind turbines) which may be arranged side by side or at least spatially close to each other.

Thereby, two wind turbines are operated according to two different operational configurations and their respective power output data are acquired. Therefore, the method employs a differential method to minimize the residual uncertainty in the estimated improvement of the annual energy production (AEP) or the improvement (or change) of the power curve. In the first measurement period or first time interval, a turbine "a" may be considered as the reference turbine (not upgraded) while the turbine "B" is upgraded and is also operated according to the upgraded operational configuration (in general second operational configuration). This measurement phase may be abbreviated with "aB". In the second measurement period or second time interval, the turbines both change their mode or their respective operational configuration. This measurement phase may then be abbreviated with "Ab". The switching scheme may be repeated until sufficient accuracy may be reached: aB, Ab, aB, Ab, aB, Ab, . . . .

This switching scheme, together with the appropriate evaluation algorithm (see below) may yield superior accuracy regarding the second power curve. The superior accuracy may result from maximized symmetry which may yield maximized error cancellation. A measurement phase like "ab" or "AB", i.e. a measurement phase, where both turbines are operated according to the same operational configuration, may not be needed, as it may yield inferior accuracy.

If more than two wind turbines are used, the accuracy may be improved by keeping adjacent turbines in different operational configurations.

Switching between the different operational configurations may be performed as often as possible as this may cancel out the effect of drift in measurement errors, environmental conditions, plant degradation. Measurements regarding power output right before and especially right after switching may be discarded. This may avoid corruption due to time synchronization errors and may allow the plants or the wind turbines to settle in their respective operational configurations. To avoid that a relevant proportion of the measurement time or measurement data is discarded, the switching period may be selected to be relatively long in comparison to the discarding period. For example, a daily switching and a discarding of 10 minutes of measurements before and 30 minutes of measurements after the switching may be convenient.

For any pair (combination) of two or more turbines, the difference between the reference (e.g. first) and the upgraded (e.g. second) operational configuration may be calculated. For pairs, where measurements are taken at the same time, more similar environmental conditions may be ensured which may yield a higher accuracy. Thus, only pairs of two different turbines may need consideration. Obviously, wake conditions may always be avoided. The overall result may be calculated as a weighted average considering measurement time for each pair. Discrepancies between results from different pairs may yield an uncertainty measure.

According to an embodiment of the present invention, deriving the second power curve comprises: deriving a first estimate of the second power curve employing a calculation scheme, the calculation scheme having as a first input the power data relating to power output of the first wind turbine (e.g. wt_A) operated according to the second operational configuration in the first time interval; the calculation scheme having as a second input the power data relating to power output of the second wind turbine (e.g. wt_B) operated according to the first operational configuration in the first time interval, wherein the calculation scheme further uses the first power curve, to derive the first estimate of the second power curve, wherein the second power curve is derived further based on the first estimate of the second power curve, wherein the calculation scheme in particular derives a difference between data supplied to the first input and data supplied to the second input.

According to an embodiment of the present invention, deriving the second power curve further comprises: deriving a second estimate of the second power curve employing the calculation scheme, the calculation scheme having as the fourth input the power data relating to power output of the second wind turbine (e.g. wt_B) operated according to the second operational configuration in the second time interval;

the calculation scheme having as the third input the power data relating to power output of the first wind turbine (e.g. wt_A) operated according to the first operational configuration in the second time interval, wherein the calculation scheme further uses the first power curve, to derive the second estimate of the second power curve, wherein the second power curve is derived further based on the second estimate of the second power curve.

The calculation scheme may be implemented as a mathematical algorithm, for example a subroutine in a software program. The calculation scheme may require data as the first input and data as the second input. The first input and the second input may require a same type (basic type or object type) of input data such as a type of a computer variable. The first input as well as the second input may for example require an array of float numbers, for example, or any particular object encapsulating an array of float values, in particular representing power output at different time points within the respective first and/or second time interval. The same calculation scheme may be applied to different representations of the first input and the second input. When a same calculation scheme is fed with different input data, the method may be simplified.

The first input and the second input and the third input and the fourth input may not necessarily be at a first and a second or third and fourth input position to a software function, but may be at any input position of a software function. The power data may for example be represented as an array of floats or any other basic numerical type. The power data may also be represented in any other object or structure of a software. The calculation scheme may be configured to derive the difference between the data supplied to the first input and the data supplied to the second input. Thus, for example, the calculation scheme may calculate the difference between the power output of the first wind turbine when operated according to the second operational configuration and the power output of the second wind turbine when operated according to the first operational configuration. The difference, when positive, may reflect an improvement regarding power output of the second operational configuration in comparison to the first operational configuration.

The power output data may comprise power output data below a nominal power and also above a nominal power. In particular, the power output data may comprise data in the partial load regime, below the nominal power output.

The first estimate of the second power curve may thus relate to or may be derived from power output measurement data when the first turbine is operated according to the second operational configuration and when the second wind turbine is operated according to the first operational configuration. In contrast, the second estimate of the second power curve may be derived from power output data when the first wind turbine is operated according to the first operational configuration and the second wind turbine is operated according to the second operational configuration. When the first estimate as well as the second estimate of the second power curve are considered, the derived second power curve may be less affected by systematic errors between the two different wind turbines in particular regarding general performance differences.

According to an embodiment of the present invention, deriving the second power curve comprises deriving the second power curve as a mean, in particular weighted mean, of the first estimate of the second power curve and the second estimate of the second power curve. Averaging or deriving the mean may reduce systematic errors. A weighting may be applied according to the respective lengths of the first time interval and the second time interval, for example.

According to an embodiment of the present invention, deriving the second power curve comprises: deriving a third estimate of the second power curve employing the calculation scheme, the calculation scheme having as the first input the power data relating to power output of the first wind turbine (e.g. wt_A) operated according to the first operational configuration in the first time interval; the calculation scheme having as the second input the power data relating to power output of the second wind turbine (e.g. wt_B) operated according to the second operational configuration in the first time interval, wherein the calculation scheme further uses the first power curve, to derive the third estimate of the second power curve, wherein the second power curve is derived further based on the third estimate of the second power curve, and/or wherein deriving the second power curve comprises: deriving a fourth estimate of the second power curve employing the calculation scheme: the calculation scheme having as the third input the power data relating to power output of the first wind turbine (e.g. wt_B) operated according to the second operational configuration in the second time interval; the calculation scheme having as the fourth input the power data relating to power output of the second wind turbine (e.g. wt_A) operated according to the first operational configuration in the second time interval, wherein the calculation scheme further uses the first power curve, to derive the fourth estimate of the second power curve, wherein the second power curve is derived further based on the fourth estimate of the second power curve.

For deriving the third estimate and the fourth estimate, no further measurement data regarding power output required beyond the output data as acquired during the first time interval and the second time interval. However, for deriving the third estimate and the fourth estimate, respectively, the calculation scheme is fed with swapped input data with respect to the first input and the second input as compared for the derivation of the first estimate and the second estimate. The inventors found that unexpectedly the third estimate and the fourth estimate are not the same (and not the negative of) as the first estimate and the second estimate, respectively. Also they are not only the negative of the first estimate or the second estimate, when a differential second power curve is considered, thus a difference between the second power curve and the first power curve. Rather, when the second power curve is derived based on the first, the second, the third and also the fourth estimate of the second power curve, accuracy of the second power curve may be improved and in particular systematic errors may be reduced.

The accuracy may be improved by repeating the whole calculation with swapped inputs ("backwards") and finally averaging the results over the first ("forward") and second ("backward") for the following reasons:

When the whole forward calculation is simplified to DeltaF=[(A−b)+(B−a)]/2, the backward calculation DeltaB=[(a−B)+(b−A)]/2 may not exactly produce the same result except for an inverted sign, since the actual calculation is a complex algorithm that requires e.g. data binning, interpolation (curve approximated with polygon) and power capping at rated power. Due to this complexity, minor asymmetries in the process behind "(A−b)" and the process behind "(B−a)" may appear. This leads to incomplete error cancellation, which degrades accuracy and could be considered as higher order error. Repeating the whole calculation backwards allows to mostly cancel out even these higher order errors.

In contrast, conventional methods have a phase, where both turbines are not upgraded, which acts as a "zero-reference" and helps to reduce the effect of minor asymmetry from beginning. The price that is paid comes in the form of increased measurement time (or reduced accuracy if measurement duration is limited).

Before averaging over the results from first (forward) and second (backward) calculation, one may invert the result from the backward calculation. This means that not the whole power curve is inverted, but only the (vertical) differences against the reference curve (e.g. first power curve).

According to an embodiment of the present invention deriving the second power curve comprises deriving the second power curve as a mean, in particular weighted mean, of the first estimate of the second power curve, the second estimate of the second power curve, the third estimate of the second power curve and the fourth estimate of the second power curve.

Deriving the mean may further reduce systematic errors or noise contributions. A weighting may be applied according to the respective lengths of the respective first and second time interval.

According to an embodiment of the present invention, the first time interval and/or the second time interval ranges between e.g. 30 seconds and 1 day or between 1 week and 1 year, or between 30 s and 5 minutes or between 1 h and 36 h or between 1 day and one year, wherein an intermediate time interval between the first time interval and the second time interval ranges between 0.05 h and 0.5 h, and/or wherein at any time when power data are acquired and used for the calculation of the second power curve, the first wind turbine and the second wind turbine are operated in different ones of the first operational configuration and the second operational configuration, and/or wherein the first operational configuration represents a non-upgraded or reference configuration and the second operational configuration represents an upgraded operational configuration.

Other lengths of the time intervals and/or intermediate time intervals may be employed. The method does not require that the first wind turbine and the second wind turbine are operated at any time in the same operational configuration and the method does not require to acquire output data from these two different wind turbines operated in the same operational configuration. Thus, measurement time may be reduced compared to conventional methods.

The upgraded operational configuration may be upgraded with respect to hardware and/or software in comparison to the non-upgraded or reference configuration. Thereby, conventionally applied upgrades may be supported.

When there is a sufficient intermediate time interval, the wind turbines may appropriately settle to their respective newly set operational configurations.

According to an embodiment of the present invention, the method further comprises receiving power data relating to power output of the first wind turbine (e.g. wt_A) operated according to the second operational configuration in plural further first time intervals; receiving power data relating to power output of the second wind turbine (e.g. wt_B) operated according to the first operational configuration in the plural further first time intervals, receiving power data relating to power output of the first wind turbine (e.g. wt_A) operated according to the first operational configuration in plural further second time interval, receiving power data relating to power output of the second wind turbine (e.g. wt_B) operated according to the second operational configuration in the plural further second time intervals; wherein deriving the second power curve is further based on: the power data relating to power output of the first wind turbine (e.g. wt_A) operated according to the second operational configuration in the plural further first time intervals; the power data relating to power output of the second wind turbine (e.g. wt_B) operated according to the first operational configuration in the plural further first time intervals, the power data relating to power output of the first wind turbine (e.g. wt_A) operated according to the first operational configuration in the plural further second time intervals; the power data relating to power output of the second wind turbine (e.g. wt_B) operated according to the second operational configuration in the plural further second time interval; and the first power curve.

Thereby, plural switchings may be performed between respective further first time intervals and further second time intervals. The more output data (from the more time intervals) are considered, the higher the accuracy of the derived second power curve may be. In particular, systematic errors and noise may be reduced.

According to an embodiment of the present invention, using the calculation scheme, for each of the plural further first time intervals a respective further first estimate of the second power curve is derived, wherein, using the calculation scheme, for each of the plural further second time intervals a respective further second estimate of the second power curve is derived, wherein the second power curve is derived as a mean, in particular weighted mean, of the first estimate, the second estimate, the further first estimates and the further second estimates.

The respective further first estimates may be derived analogously to the first estimate mentioned above. Also the further second estimates may be calculated in analogy to the second estimate mentioned and explained above. Thereby, accuracy may further be improved.

According to an embodiment of the present invention, using the calculation scheme, for each of the plural further first time intervals a respective further third estimate of the second power curve is derived, wherein, using the calculation scheme, for each of the plural further second time intervals a respective further fourth estimate of the second power curve is derived, wherein the second power curve is derived as a mean, in particular weighted mean, of the first estimate, the second estimate, the third estimate, the fourth estimate, the further first estimates and the further second estimates, the further third estimates and the further fourth estimates.

Herein again, no additional measurement time intervals are required but the further third estimates and the further fourth estimates are derived based on same power output data as acquired in the further first time intervals and the further second time intervals.

According to an embodiment of the present invention, the calculation scheme derives power differences between data supplied to the first input and data supplied to the second input, and/or the calculation scheme derives power differences between data supplied to the third input and data supplied to the fourth input, wherein the calculation scheme uses the power data relating to power output of the second wind turbine (e.g. wt_B) operated according to the first operational configuration and the first power curve, to assign the power differences to different wind speed bins, and/or wherein the calculation scheme uses the power data relating to power output of the first wind turbine (wt_A) operated according to the first operational configuration and the first power curve, to assign the power differences to different wind speed bins, wherein the calculation scheme averages the power differences in each wind speed bin, to derive a power change for each wind speed bin, in order to derive a differential form of the second power curve, wherein the calculation scheme is in particular adapted to integrate or sum the power changes for all wind speed bins according to a local or a reference wind speed distribution, to derive a difference of total energy production.

The first power curve comprises the information of the power output for plural wind speed values, when the wind turbine is operated according to the first operational configuration. Thus, the first power curve may enable to infer the respective wind speed value from the power output of the wind turbine as operated according to the first operational configuration. Wind speed bins may be defined as plural wind speed ranges from for example wind speed 0 to nominal wind speed. For example, 5 to 20 wind speed bins may be provided between wind speed zero and a nominal wind speed for example.

The differential form of the second power curve may thus represent a change of the power curve compared to the first power curve which change results, when the wind turbine is operated according to the second operational configuration. According to embodiments of the present invention, the method may output the differential form of the second power curve without providing the second power curve in an absolute form. In order to derive a single assessment or performance value, also the integral of the second power curve or even the differential form of the second power curve may be provided. The single value may indicate a performance gain.

According to an embodiment of the present invention, the first power curve specifies active power output in dependence of wind speed, when the first and/or second wind turbine is operated according to the first operational configuration, wherein the second power curve specifies active power output in dependence of wind speed, when the first and/or second wind turbine is operated according to the second operational configuration. Thereby, conventionally utilized performance data are provided or supported.

According to an embodiment of the present invention, the first operational configuration differs from the second operational configuration in at least one of: hardware configuration; software configuration, in particular control software configuration, in particular specifying pitch angle and/or torque and/or yaw angle in dependence on at least one operational parameter including rotational speed and/or wind speed.

The hardware configuration may for example be different regarding used wind turbine blades or wind turbine blade add-ons, regarding power converters, regarding filter electronics, regarding control hardware or computer hardware and so on.

The software configuration may be different regarding normal operation control software, partial load control software, reference curves, working points, nominal power output, nominal rotational speed, nominal wind speed, pitch angle reference curves, torque reference curves or yaw angle reference curves for example. Thereby, different configurational changes are supported.

According to an embodiment of the present invention, the method is applied to N wind turbines, in particular front wind turbines that often face free, undisturbed wind, wherein plural wind turbine pairs, in particular N−1 overlapping pairs are defined, each pair comprising immediately adjacent wind turbines, wherein for each pair one of the wind turbine is operated, in any time interval, according to the first operational configuration and the other one is operated according to the second operational configuration for generating the power related data, wherein results for the second power curve as obtained using power data from any pair are averaged to derive the second power curve.

E.g. four turbines may be selected for calculation of AEP improvement: referred to as #1, #2, #3, #4. These may be in the front row of a wind park, where the turbines are that most often have free wind. This means free inflow and no disturbance from other turbines. These turbines may be located in a somewhat straight line. This makes #2 most close to #1 and #3. And #3 most close to #2 and #4. With the switching scheme there can be defined not just two pairs, e.g. (#1, #2) and (#3, #4), but also a third pair (#2, #3) of adjacent turbines. This improves again accuracy of final AEP estimate which is calculated by averaging as a very last step over the AEP improvements of all involved turbine pairs.

According to an embodiment of the present invention it is provided a method of obtaining a power curve of a changed turbine configuration, based on an existing power curve of the baseline configuration and measuring power in at least one pair of turbines, where both turbines switch at least once between the two configurations "baseline" and "changed" for the measurement time. Wind measurements are completely avoided. It may be avoided that during the configuration switching the two turbines, which form a pair, are ever in the same configuration.

According to an embodiment of the present invention the switching scheme always keeps neighboring turbines in different configurations. This allows creating the maximum amount of pairs that are neighbours (close together->same wind) and always have different configuration. With for example four turbines in a row, this method allows to form and calculate not just 2 but 3 optimal pairs of turbines. The final resulting power curve (or an AEP derived based on a known wind distribution) is obtained from averaging over all available pairs.

It should be understood, that features, individually or in any combination, disclosed, explained, provided or applied to a method of estimating a second power curve of a wind turbine regarding a second operational configuration, are also, individually or in any combination, applicable to an arrangement for estimating a second power curve of a wind turbine according to embodiments of the present invention and vice versa.

According to an embodiment of the present invention it is provided an arrangement for estimating a second power curve of a wind turbine regarding a second operational configuration, the arrangement comprising a processor, having an input adapted: to receive power output data pertaining to a first operational configuration, in particular reference operational configuration; to receive power data relating to power output pertaining to the second operational configuration; to derive the second power curve using the power output data pertaining to the first operational configuration, the power output data pertaining to the second operational configuration and a first power curve of the first operational configuration.

The arrangement may in particular be configured to carry out the method of estimating a second power curve according to an embodiment of the present invention.

The arrangement may be implemented in software and/or hardware. The arrangement may further comprise measurement sensors adapted to measure power output of one or more wind turbines. The arrangement may also comprise a control module which may be capable of controlling a first wind turbine and a second wind turbine regarding respective operational configuration.

According to an embodiment of the present invention it is provided a test system, comprising: an arrangement according to the preceding embodiment; at least one first wind turbine; at least one second wind turbine, the arrangement being communicatively connected to the wind turbines, in order to receive power related data and/or control the wind turbines.

The aspects defined above and further aspects of embodiments of the present invention are apparent from the examples of embodiment to be described hereinafter and are explained with reference to the examples of embodiment. Embodiments of the invention will be described in more detail hereinafter with reference to examples of embodiment but to which the invention is not limited.

BRIEF DESCRIPTION

Figure 2:
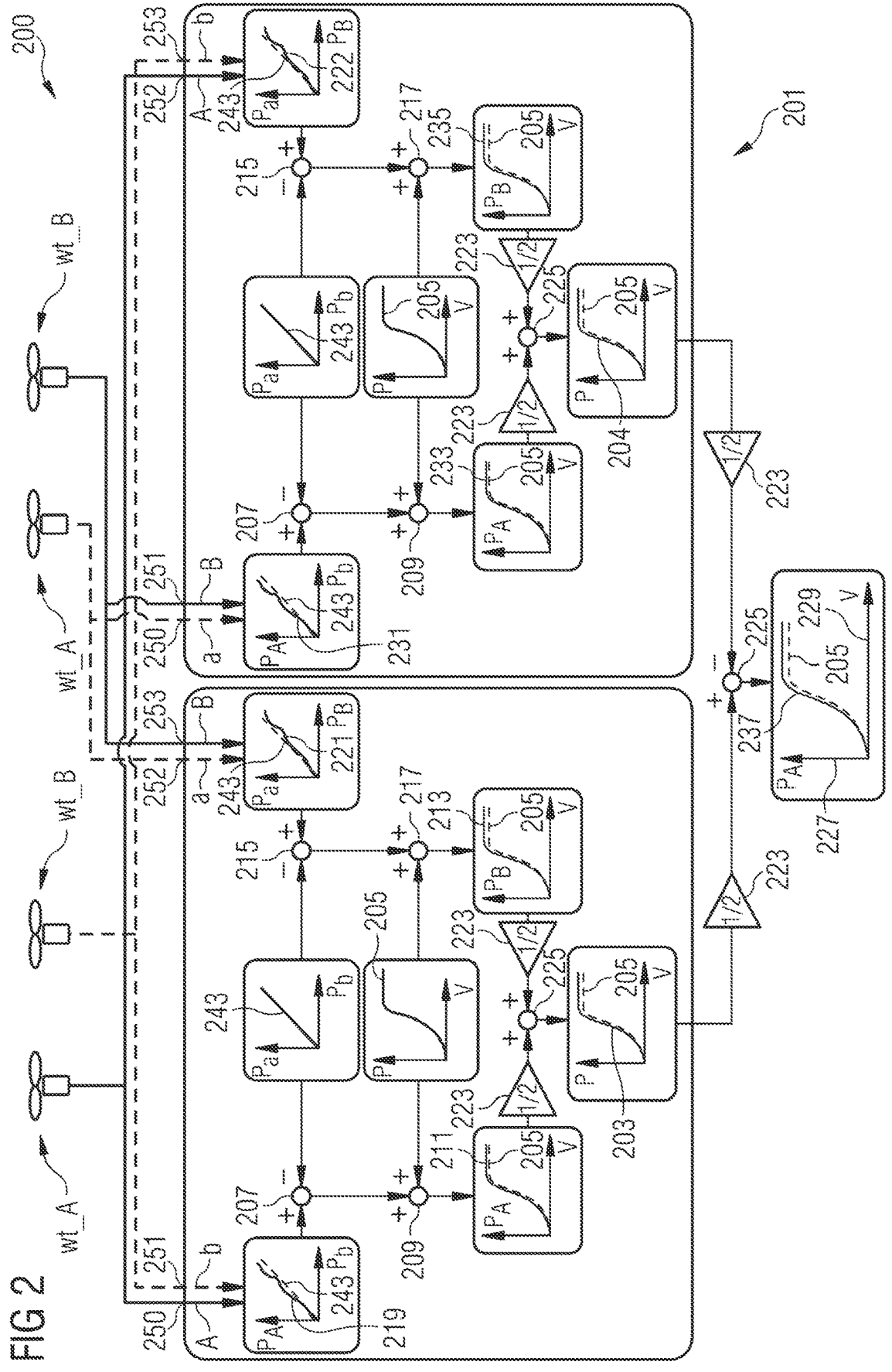

Some of the embodiments will be described in detail, with reference to the following figures, wherein like designations denote like members, wherein:

FIG. 1 schematically illustrates a test system according to an embodiment of the present invention and further illustrates method steps according to a method according to an embodiment of the present invention; and FIG. 2 schematically illustrates a test system according to an embodiment of the present invention and further illustrates method steps according to a method according to an embodiment of the present invention;

DETAILED DESCRIPTION

The illustration in the drawings is in schematic form. It is noted that in different figures, elements similar or identical in structure and/or function are provided with the same reference signs or with reference signs, which differ only within the first digit. A description of an element not described in one embodiment may be taken from a description of this element with respect to another embodiment.

The test system 100 schematically illustrated in FIG. 1 comprises an arrangement 101 for estimating a second power curve 103 of a wind turbine wt_A, wt_B regarding a second operational configuration (for example upgraded operational configuration) according to an embodiment of the present invention. The arrangement 101 comprises a not in detail illustrated processor which has an input section which is adapted to receive power output data of the wind turbines wt_A, wt_B regarding a first operational configuration and regarding a second operational configuration.

In the embodiment illustrated in FIG. 1, the letter "A" (or P_A) denotes power output of the wind turbine wt_A operated according to the second operational configuration and the letter "b" (or P_b) represents the power output output by the second wind turbine wt_B when operated according to first operational configuration. The arrangement 101 is configured to derive the second power curve 103 using the power output data "b" pertaining to the first operational configuration, the power output data "A" pertaining to the second operational configuration and a first power curve 105 of the first operational configuration.

The test system 100 further comprises at least one first wind turbine wt_A and at least one second wind turbine wt_B. Thereby, the arrangement 101 is communicatively connected to the wind turbines wt_A, wt_B in order to receive the power related data of "A" and "b" and also receive the power output data "a" and "B". In the embodiment illustrated in FIG. 1, the arrangement 101 receives the power output data "A" relating to the power output of the first wind turbine (wt_A) operated according to the second operational configuration in a first time interval. Furthermore, the arrangement 101 receives power data "b" relating to power output of the second wind turbine (wt_B) operated according to the first operational configuration in the first time interval.

Furthermore, the arrangement 101 receives power data "a" (or P_a) relating to power output of the first wind turbine wt_A operated according to first operational configuration in a second time interval, being different from the first time interval. Furthermore, the arrangement receives power data "B" (or P_B) relating to power output of the second wind turbine wt_B operated according to second operational configuration in the second time interval.

Based on the received power data "Ab" and "aB", the arrangement derives the second power curve 103. In particular, from the power output data Ab, a calculation scheme comprising difference element 107 and addition element 109 as well as a not illustrated processor derives a first estimate 111 of the second power curve. Thereby, from the power data Ab, an expected behaviour 143 is subtracted using the subtraction element 107. The result output by the subtraction element 107 is guided or supplied to the addition element 109 which adds thereto an expected original power curve, i.e. the first power curve 105. The output of the addition element 109 is the first estimate 111 of the second power curve. The dashed line indicates the expected original power curve 105. As can be appreciated from FIG. 1, the first estimate 111 is above the power curve 105.

In a similar manner, the arrangement 101 calculates a second estimate 113 of the second power curve by processing the power output data aB using similar subtraction elements 115 and addition element 117. In FIG. 1, the power output data A,b are in a combined manner depicted as a power curve 119. The output data aB are depicted in a combined manner as a curve 121.

Using a gain factor element 123 and an addition element 125, the first estimate 111 and the second estimate 113 are averaged, in order to arrive at the second power curve 103. The second power curve 103 defines a relationship of the power on the ordinate 127 in dependency of the wind speed v at the abscissa 129. The change OverallDeltaAEP of the annual energy production may be calculated according to the following formula:

$$OverallDeltaAEP = (DeltaAEP(B - a) + DeltaAEP(A - b))/2$$

wherein OverallDeltaAEP may respresent the second power curve 103, DeltaAEP(B−a) may represent the second estimate 113 and DeltaAEP(A−b) may respresent the first estimate 111, e.g., or a respective integral value.

FIG. 2 schematically illustrates a test system 200 according to an embodiment of the present invention, wherein elements similar in structure and/or function are labeled with reference signs in FIGS. 1 and 2 which differ only in the first digit. An explanation of one element not explicitly described in one or with reference to one particular figure may be taken from a description of this element with respect to the other figure.

The left-hand side of FIG. 2 corresponds to FIG. 1. The right-hand side illustrates schematically an application of the calculation scheme with swapped inputs with respect to the left-hand side which is applied according to embodiments of the present invention. As can for example appreciated from FIG. 2 on the left-hand side, the power curve 219 depicting the power output Ab in combination is obtained by providing as a first input 250 the output power A, i.e. the output power output by the wind turbine wt_A when operated according to the second operational configuration. As a second input 251, b is provided, i.e. the power output of the second wind turbine wt_B when operated according to the first operational configuration.

As can for example appreciated from FIG. 2 on the left-hand side, the power curve 243 depicting the power output aB in combination is obtained by providing as a third input 252 the output power a, i.e. the output power output by the wind turbine wt_A when operated according to the first operational configuration. As a forth input 253, B is provided, i.e. the power output of the second wind turbine wt_B when operated according to the second operational configuration.

In contrast thereto, on the right-hand side, the power curve 231 is produced when the output data a, i.e. the output data of the first wind turbine wt_A when operated according to the first operational configuration is provided as the data for the first input 250. As the data for the second input 251, the output data B, i.e. the power output of the second wind turbine wt_A as operated according to the second operation is provided.

The first estimate 211 and the second estimate 213 depicted on the left-hand side are equal to the first estimate 111 and the second estimate 113, respectively, depicted in FIG. 1. From the swapped input operated calculation scheme, arrangement 201 derives a third estimate 233 from the power output data aB in a similar manner as the first estimate 211 was derived from the power output data Ab. From the power output data aB, the arrangement 201 calculates the second estimate 213 of the second power curve. In contrast, by swapping the inputs to the calculation scheme, from the power output data Ab, the arrangement calculates a fourth estimate 235 of the second power curve. Using further gain elements 223 (having gain of ½), the first estimate 211, the second estimate 213, the third estimate 233 and a fourth estimate 235 derived curve are averaged in order to derive the second power curve 237.

Note that in FIG. 2, at summation 225 there is a "minus" sign on the right hand side. This means here that not simply the whole power curve 204 is inverted, but only the difference of 204 against the reference 205.

According to an embodiment of the present invention accuracy is improved by calculating the power curve "Forward" (with non-swapped inputs) and "Backward" (with swapped inputs) and average over the two obtained results to improve error cancelation. Thereby, "Forward" is the process on the left side that ends with preliminary power curve estimate 203. "Backward" is the process on the right side that ends with preliminary power curve estimate 205. The process used in "Forward" and "Backward" is completely identical—except for the swapped inputs. This means that for "Backward", data from "baseline" configuration is considered as if it came from "changed" configuration. And vice versa. So the mapping is: a->A, A->a and b->B, B->b.

The methods illustrated in FIGS. 1 and 2 may be performed by only considering two measuring time intervals, namely a first time interval where the output data Ab are acquired and a second time interval where the power output data aB are acquired. To improve the second power curve, plural further first and second time intervals, where additional power output data are measured may be considered and taken into account to derive the improved second power curve, e.g. by averaging.

Thus, the evaluations on the left-hand side and the right-hand side on FIG. 2 apply the same calculation scheme with swapped inputs. By that it may be meant that the measurements from first operational configuration are considered as being from second operation configuration and vice versa. The result of the swapped calculation may be OverallDeltaAEP_Swap. The expectation for an unbiased estimate may be that $-1*OverallDeltaAEP\_Swap=OverallDeltaAEP$.

It is however found, that there are minor deviations to that expectation. These deviations result from incomplete error cancellation in the complex algorithm which includes data binning, interpolation and capping at rated power. This leads to minor asymmetries in the errors of the intermediate power curves 111 and 113 and hence to incomplete error cancellation. By repeating the whole calculation with swapped inputs, the symmetry and thus the error cancellation are greatly improved.

Monte Carlo simulations indicate that the described solution yields superior accuracy compared to conventional methods. When compared to published solutions, there is a reduction in the standard deviation of the residual uncertainty of around 20%.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method of estimating a second power curve of a wind turbine regarding a second operational configuration, the method comprising:
  receiving power output data (a, b, pertaining to a first operational configuration;
  receiving power data-relating to power output pertaining to the second operational configuration;
  deriving the second power curve-using the power output data fab pertaining to the first operational configuration, the power output data pertaining to the second operational configuration and a first power curve of the first operational configuration, wherein receiving power data relating to a power output pertaining to the second operational configuration comprises:
  receiving power data relating to a power output of at least one first wind turbine operated according to the second operational configuration in a first time interval;
  receiving power output data pertaining to the first operational configuration comprises:
  receiving power data b relating to a power output of at least one second wind turbine operated according to the first operational configuration in the first time interval, the method further comprising:
  receiving power data relating to a power output of the first wind turbine operated according to the first operational configuration in a second time interval,
  receiving power data relating to a power output of the second wind turbine operated according to the second operational configuration in the second time interval;
  wherein deriving the second power curve is based on:

the power data relating to a power output of the first wind turbine operated according to the second operational configuration in the first time interval;

the power data-relating to a power output of the second wind turbine operated according to the first operational configuration in the first time interval, the power data relating to a power output of the first wind turbine operated according to the first operational configuration in the second time interval;

the power data relating to a power output of the second wind turbine operated according to the second operational configuration in the second time interval; and the first power curve, wherein the first wind turbine and the second wind turbine are operated at the same time interval always in different operational configurations, wherein deriving the second power curve comprises:

deriving a first estimate of the second power curve employing a calculation scheme, the calculation scheme having as a first input the power data relating to power output of the first wind turbine operated according to the second operational configuration in the first time interval;

the calculation scheme having as a second input the power data relating to power output of the second wind turbine operated according to the first operational configuration in the first time interval, wherein the calculation scheme further uses the first power curve, to derive the first estimate of the second power curve, wherein the second power curve is derived further based on the first estimate of the second power curve, wherein the calculation scheme derives a difference between data supplied to the first input and data supplied to the second input.

2. The method according to claim 1 wherein deriving the second power curve further comprises:

deriving a second estimate the second power curve employing the calculation scheme, the calculation scheme having as the fourth input the power data relating to power output of the second wind turbine operated according to the second operational configuration in the second time interval;

the calculation scheme having as the third input the power data relating to power output of the first wind turbine operated according to the first operational configuration in the second time interval, wherein the calculation scheme further uses the first power curve, to derive the second estimate of the second power curve, wherein the second power curve is derived further based on the second estimate of the second power curve.

3. The method according to claim 2, wherein deriving the second power curve comprises:

deriving the second power curve as a mean, in particular weighted mean, of the first estimate the second power curve and the second estimate of the second power curve.

4. The method according to claim 2, wherein deriving the second power curve comprises:

deriving a third estimate of the second power curve employing the calculation scheme, the calculation scheme having as a first input the power data relating to power output of the first wind turbine operated according to the first operational configuration in the first time interval;

the calculation scheme having as the second input the power data relating to power output of the second wind turbine operated according to the second operational configuration in the first time interval, wherein the calculation scheme further uses the first power curve, to derive the third estimate of the second power curve, wherein the second power curve is derived further based on the third estimate of the second power curve, and/or wherein deriving the second power curve comprises:

deriving a fourth estimate of the second power curve employing the calculation scheme:

the calculation scheme having as the third input the power data relating to power output of the first wind turbine operated according to the second operational configuration in the second time interval;

the calculation scheme having as the fourth input the power data relating to power output of the second wind turbine operated according to the first operational configuration in the second time interval, wherein the calculation scheme further uses the first power curve, to derive the fourth estimate of the second power curve, wherein the second power curve is derived further based on the fourth estimate of the second power curve.

5. The method according to claim 4, wherein deriving the second power curve comprises:

deriving the second power curve as a mean, in particular weighted mean, of the first estimate of the second power curve, the second estimate of the second power curve, the third estimate of the second power curve and a fourth estimate derived curve derived from the fourth estimate of the second power curve and the first power curve, the fourth estimate derived curve in particular being obtained by mirroring the fourth estimate at the first power curve.

6. The method according to claim 1, wherein the first time interval and/or the second time interval ranges between 30 seconds and one minute, or between 1 h and 36 h or between one day and one year, wherein an intermediate time interval between the first time interval and the second time interval ranges between 0.05 h and 0.5 h, and/or wherein at any time when power data are acquired and used for the calculation of the second power curve, the first wind turbine and the second wind turbine are operated in different ones of the first operational configuration and the second operational configuration, and/or wherein the first operational configuration represents a non-upgraded or reference configuration and the second operational configuration represents an upgraded operational configuration.

7. The method according to claim 1, further comprising:

receiving power data relating to power output of the first wind turbine operated according to the second operational configuration in plural further first time intervals;

receiving power data relating to power output of the second wind turbine operated according to the first operational configuration in the plural further first time intervals, receiving power data relating to power output of the first wind turbine operated according to the first operational configuration in plural further second time interval, receiving power data relating to power output of the second wind turbine operated according to the second operational configuration in the plural further second time intervals;

wherein deriving the second power curve is further based on:

the power data relating to power output of the first wind turbine operated according to the second operational configuration in the plural further first time intervals;

the power data relating to power output of the second wind turbine operated according to the first operational configuration in the plural further first time intervals, the power data relating to power output of the first wind turbine operated according to the first operational configuration in the plural further second time intervals;

the power data relating to power output of the second wind turbine operated according to the second operational configuration in the plural further second time interval; and the first power curve.

8. The method according to claim 7, wherein, using the calculation scheme, for each of the plural further first time intervals a respective further first estimate of the second power curve is derived, wherein, using the calculation scheme, for each of the plural further second time intervals a respective further second estimate of the second power curve is derived, wherein the second power curve is derived as a mean, in particular weighted mean, of the first estimate, the second estimate, the further first estimates and the further second estimates.

9. The method according to claim 8, wherein, using the calculation scheme, for each of the plural further first time intervals a respective further third estimate of the second power curve is derived, wherein, using the calculation scheme, for each of the plural further second time intervals a respective further fourth estimate of the second power curve is derived, wherein the second power curve is derived as a mean, in particular weighted mean, of the first estimate, the second estimate, the third estimate, the fourth estimate, the further first estimates and the further second estimates, the further third estimates and the further fourth estimates.

10. The method according to claim 2, wherein the calculation scheme derives power differences between data supplied to the first input and data supplied to the second input, wherein the calculation scheme derives power differences between data supplied to the third input and data supplied to the fourth input, wherein the calculation scheme uses the power data relating to power output of the second wind turbine operated according to the first operational configuration and the first power curve, to assign the power differences to different wind speed bins, and/or wherein the calculation scheme uses the power data relating to power output of the first wind turbine operated according to the first operational configuration and the first power curve, to assign the power differences to different wind speed bins, wherein the calculation scheme averages the power differences in each wind speed bin, to derive a power change for each wind speed bin, in order to derive a differential form of the second power curve, wherein the calculation scheme is in particular adapted to integrate or sum the power changes for all wind speed bins according to a local or a reference wind speed distribution, to derive a difference of total energy production.

11. The method according to claim 1, wherein the first power curve specifies active power output in dependence of wind speed, when the first and/or second wind turbine is operated according to the first operational configuration, wherein the second power curve specifies active power output in dependence of wind speed, when the first and/or second wind turbine is operated according to the second operational configuration.

12. The method according to claim 1, wherein the first operational configuration differs from the second operational configuration in at least one of:

hardware configuration;

software configuration, in particular control software configuration, in particular specifying pitch angle and/or torque and/or yaw angle in dependence on at least one operational parameter including rotational speed and/or wind speed.

13. The method according to claim 1, wherein the method is applied to N wind turbines, in particular front wind turbines that are exposed to free undisturbed wind, wherein plural are defined, each pair comprising immediately adjacent wind turbines, wherein for each pair one of the wind turbine is operated, in any time interval, according to the first operational configuration and the other one is operated according to the second operational configuration for generating the power related data, wherein results for the second power curve as obtained using power data from any pair are averaged to derive the second power curve.

14. An arrangement for estimating a second power curve of a wind turbine regarding a second operational configuration, the arrangement comprising a processor, having an input adapted:

to receive power output data pertaining to a first operational configuration;

to receive power data relating to power output pertaining to the second operational configuration;

to derive the second power curve using the power output data pertaining to the first operational configuration, the power output data pertaining to the second operational configuration and a first power curve of the first operational configuration, wherein deriving the second power curve comprises:

deriving a first estimate of the second power curve employing a calculation scheme, the calculation scheme having as a first input the power data relating to power output of the first wind turbine operated according to the second operational configuration in the first time interval;

the calculation scheme having as a second input the power data relating to power output of the second wind turbine operated according to the first operational configuration in the first time interval, wherein the calculation scheme further uses the first power curve, to derive the first estimate of the second power curve, wherein the second power curve is derived further based on the first estimate of the second power curve, the arrangement being adapted to control or carry out a method according to one of the preceding claims.

15. A test system, comprising:

the arrangement according to claim 14;

at least one first wind turbine;

at least one second wind turbine, the arrangement being communicatively connected to the wind turbines, in order to receive power related data and/or control the wind turbines.

* * * * *